(12) United States Patent
Maroney et al.

(10) Patent No.: US 6,336,691 B1
(45) Date of Patent: Jan. 8, 2002

(54) STORAGE CABINET FOR ELECTRONIC DEVICES

(75) Inventors: Ralf P. Maroney, Orange; Jeffrey P. Crouch, Uncasville, both of CT (US)

(73) Assignee: Plug-In Storage Systems, Inc., Orange, CT (US)

( * ) Notice: Subject to any disclaimer, the term of this patent is extended or adjusted under 35 U.S.C. 154(b) by 0 days.

(21) Appl. No.: 09/305,889

(22) Filed: May 5, 1999

(51) Int. Cl.[7] .............................................. H05K 15/00
(52) U.S. Cl. ................. 312/236; 312/223.1; 312/223.6; 312/213; 361/725
(58) Field of Search .............................. 312/213, 223.1, 312/223.2, 223.3, 223.6, 334.2, 330.1, 198, 236; 108/50.02; 454/184; 361/725, 727; 211/26

(56) References Cited

U.S. PATENT DOCUMENTS

| | | | |
|---|---|---|---|
| 1,930,180 A | * 10/1933 | Naylor | 312/213 X |
| 2,774,808 A | * 12/1956 | Bullock | 312/213 X |
| 3,192,306 A | * 6/1965 | Skonnord | 312/213 X |
| 3,662,667 A | 5/1972 | Murawski et al. | |
| 3,691,432 A | 9/1972 | Edfors et al. | |
| 3,781,761 A | 12/1973 | Harwood | |
| 4,600,249 A | 7/1986 | Anderson | |
| 4,753,496 A | 6/1988 | Bussard | |
| 4,828,340 A | * 5/1989 | Jorgensen | 312/213 |
| 5,018,052 A | 5/1991 | Ammon et al. | |
| 5,093,887 A | 3/1992 | Witte | |
| 5,221,813 A | 6/1993 | Michael et al. | |
| 5,230,552 A | * 7/1993 | Schipper et al. | 312/223.6 |
| 5,460,441 A | * 10/1995 | Hastings et al. | 312/223.2 X |
| 5,471,099 A | 11/1995 | Larabell et al. | |
| 5,549,375 A | * 8/1996 | Pagliaccio | 312/223.2 X |
| 5,750,934 A | 5/1998 | Kuljis | |
| 5,782,546 A | 6/1998 | Iwatare | |
| 5,784,255 A | 6/1998 | Wyland | |
| 5,816,081 A | * 10/1998 | Johnston | 312/223.6 X |

OTHER PUBLICATIONS

IBM Technical Disclosure Bulletin, vol. 17, No. 9,pp. 2529–2530, Authors: J R Hammer, R L Snyder, Feb. 1975.

* cited by examiner

Primary Examiner—Peter M. Cuomo
Assistant Examiner—Michael J. Fisher
(74) Attorney, Agent, or Firm—Cummings & Lockwood

(57) ABSTRACT

A storage cabinet includes a housing having at least one exterior port, at least one interior port positioned above the exterior port, and a convection passageway connecting the exterior port and the interior port such that warm air will rise within the passageway by natural convection from the exterior port to the interior port. The cabinet also includes at least one drawer received within the housing and moveable between a closed position wherein a storage space within the drawer is inaccessible from outside the housing, and an open position wherein the drawer extends out of the housing such that the storage space is accessible. The drawer has at least one inlet for allowing airflow to pass from the interior port of the housing to the storage space of the drawer when the drawer is in the closed position. Another storage cabinet provided by the present disclosure includes a housing and at least one drawer received within the housing and moveable between a closed position and an open position. The cabinet includes a support for supporting a wire between the housing and the drawer. The support has a first end pivotly connected to the housing, a second end pivotly connected to the drawer, and at least one joint between the first and the second ends for allowing the support to bend.

28 Claims, 5 Drawing Sheets

STORAGE CABINET FOR ELECTRONIC DEVICES

BACKGROUND

The present disclosure relates to a storage cabinet and, more particularly, to a storage cabinet having locking drawers. Even more particularly, the present invention relates to a storage cabinet having means for providing passive cooling and means for supporting data transmission and/or power cords between each sliding drawer and the cabinet.

Cabinets have previously been used for storing electronic devices, such as rechargeable laptop computers, tracking devices and test equipment. This type of cabinet can be used, for example, by telephone, delivery and other businesses which employ numerous laptop or like electronic devices that are used by service employees. Such devices typically must be securely stored overnight, recharged, and updated with new data.

Thus, there is a need for a storage cabinet having locks to provide a secure storage environment, battery chargers for recharging the stored electronic devices, and data ports for transmitting data to and from the stored electronic devices.

It has been found that some existing storage cabinetry for electronic devices do not provide adequate cooling for the stored, recharging electronic devices. As a result, the electronic devices can become too hot during periods of recharging and/or data transmission, and automatically shut down. As a result, when employees retrieve the shut down computers or other electronic devices, the devices either have an insufficient charge or have not completed necessary data transmissions for allowing the employees to perform their jobs. This result can lead to employee down time and significant additional expense and is, therefore, undesirable.

Accordingly, there is also a need for a storage cabinet having means for cooling in order to maintain stored, recharging electronic devices below a threshold temperature to prevent the devices from overheating and turning off. Preferably, the storage cabinet will incorporate a passive cooling means, such that fans or like active cooling means are not necessary, and such that the complexity, cost and necessary maintainence of the storage cabinet is reduced.

A storage cabinet will also preferably include sliding drawers for receiving and storing the electronic device, such that inserting and removing the electronic devices from the cabinet is made more convenient. Thus, there is also a need for a storage cabinet having means for supporting data transmission and/or power cords between each sliding drawer and the cabinet, such that the cords do not become tangled and are easily accessible.

SUMMARY OF DISCLOSURE

Accordingly, the present disclosure provides a storage cabinet includes a housing having at least one exterior port, at least one interior port positioned above the exterior port, and a convection passageway connecting the exterior port and the interior port such that warm air rises within the passageway by natural convection from the exterior port to the interior port. The cabinet also includes at least one drawer received within the housing and moveable between a closed position wherein a storage space within the drawer is inaccessible from outside the housing, and an open position wherein the drawer extends out of the housing such that the storage space is accessible. The drawer has at least one inlet for allowing airflow to pass from the interior port of the housing to the storage space of the drawer when the drawer is in the closed position, whereby the storage cabinet provides passive cooling for electronic devices contained in the storage space of the drawer.

According to other aspects of the present disclosure, the storage cabinet includes electrical outlets and telephone plugs for connection to electronic devices stored within the cabinet, and a lock for allowing the drawer to be locked in the closed position.

Another storage cabinet provided by the present disclosure includes a housing and at least one drawer received within the housing and moveable between a closed position and an open position. The cabinet includes a support for supporting a wire between the housing and the drawer. The support has a first end pivotally connected to the housing, a second end pivotally connected to the drawer, and a joint positioned between the first and the second ends for allowing the support to bend and move with the drawer as the drawer is moved between an open and closed position.

BRIEF DESCRIPTION OF THE DRAWINGS

So that those having ordinary skill in the art to which this disclosure pertains will more readily understand how to construct a storage cabinet in accordance with this disclosure, preferred embodiments of the storage cabinet will be described in detail hereinbelow with reference to the drawings wherein.

DETAILED DESCRIPTION

Figure 1:
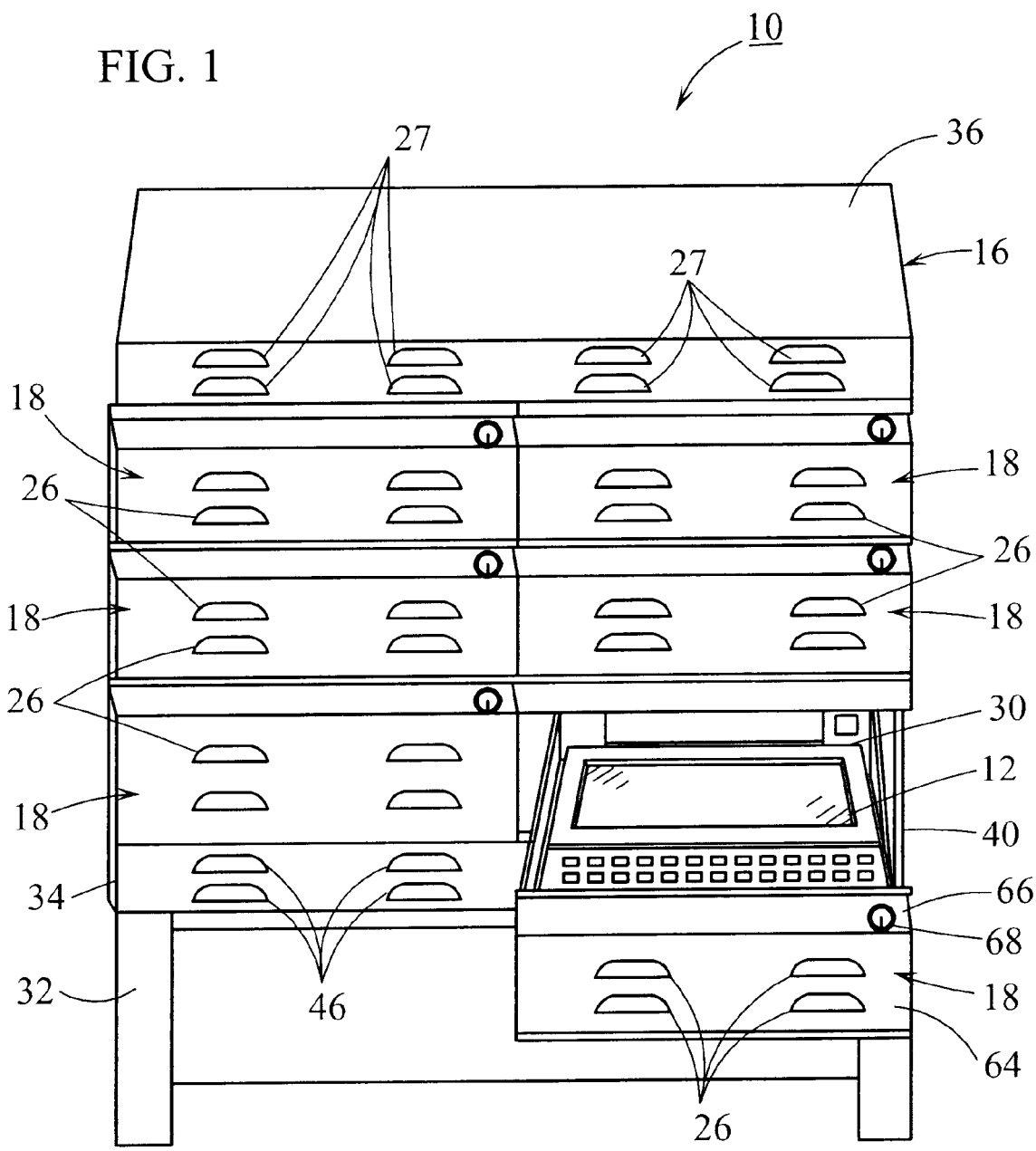
FIG. 1 shows a front isometric view of a storage cabinet according to the present disclosure shown with a drawer of the cabinet in an open position and containing an electronic device in the form of a laptop computer.
Figure 2:
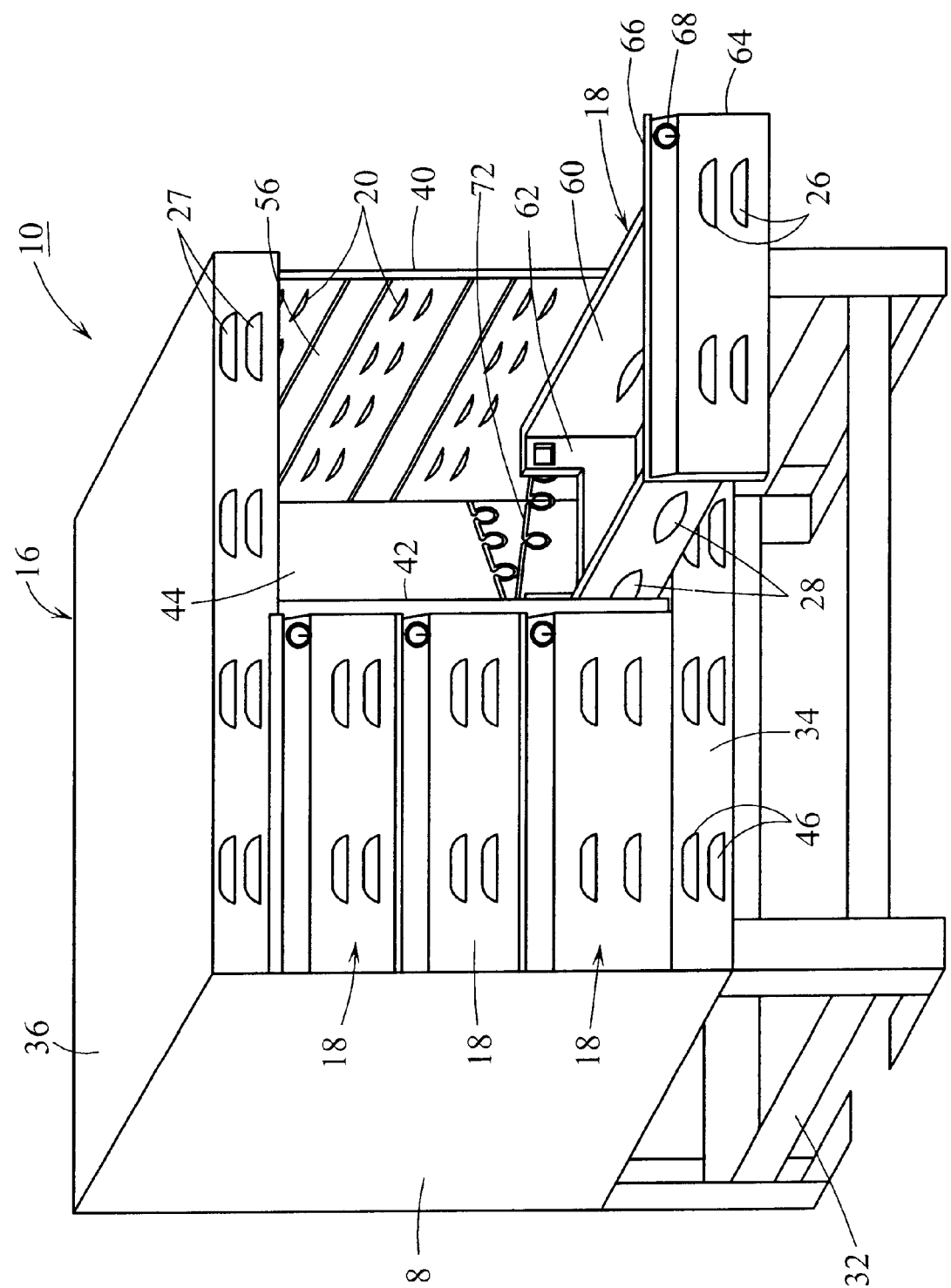
FIG. 2 shows a side isometric view of the storage cabinet of FIG. 1 shown with two of the drawers removed and another of the drawers in an open position, with an articulated cord support according to the present disclosure extending between the open drawer and a housing of the cabinet.
Figure 3:
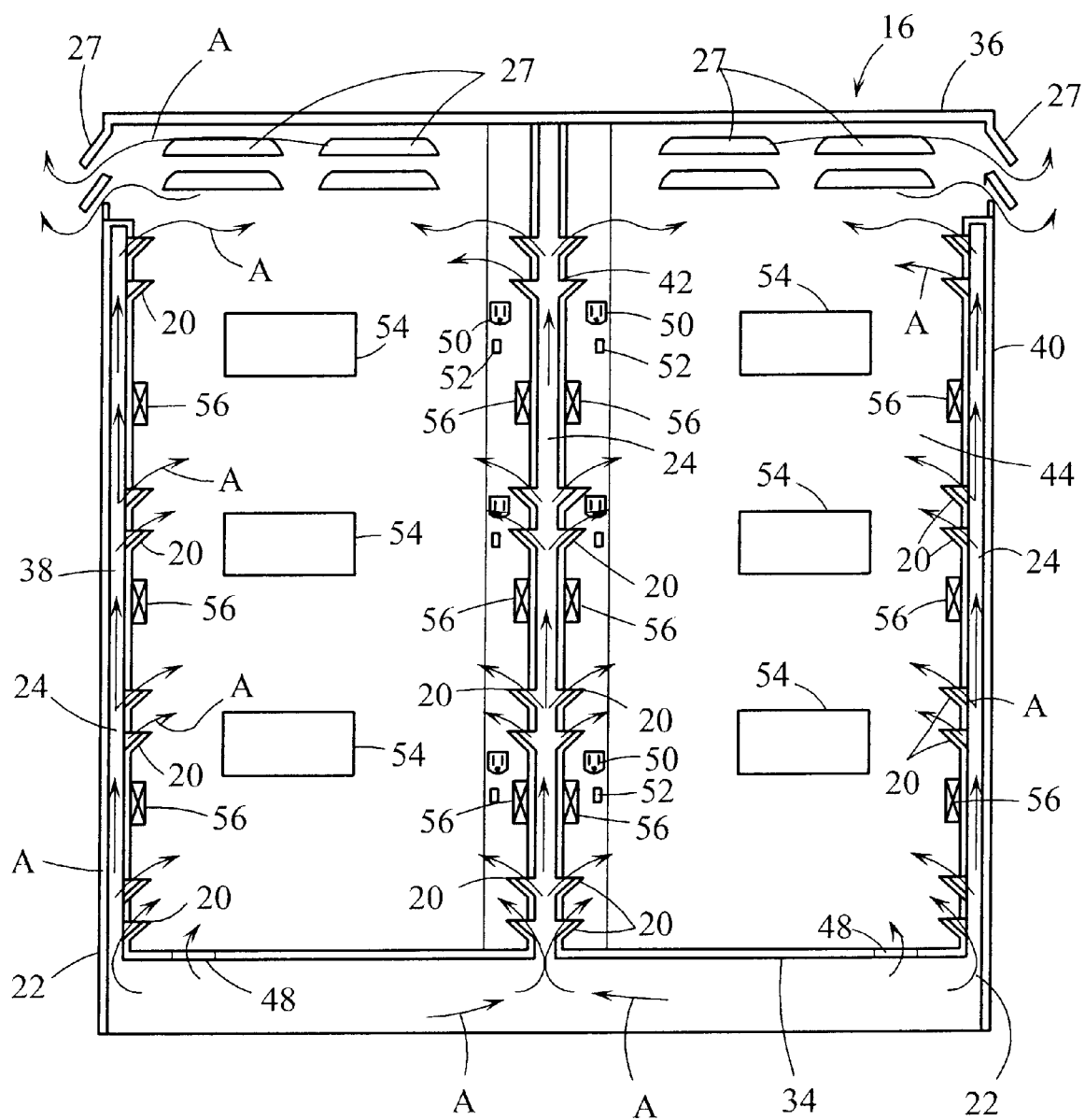
FIG. 3 shows a front sectional view of the housing of the storage cabinet of FIG. 1.
Figure 4:
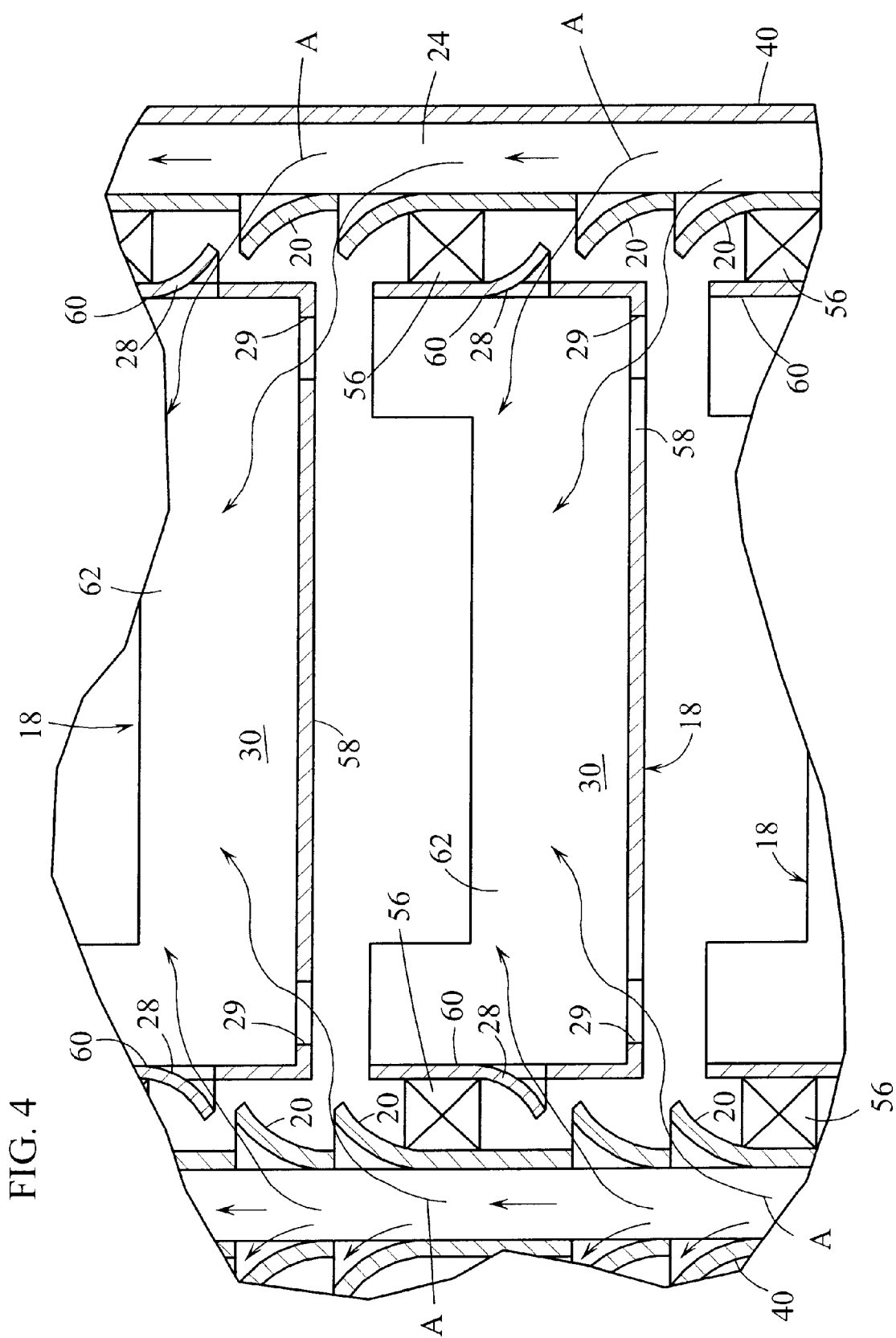
FIG. 4 shows a partial front sectional view of the housing and two of the drawers of the storage-cabinet of FIG. 1.

Referring to the attached figures, a storage cabinet 10 according to the present disclosure includes means for providing passive cooling to prevent electronic devices, such as a laptop computer 12, stored within the cabinet from overheating and turning off. In addition, the storage cabinet 10 includes means for supporting wires and cords 14 between a housing 16 of the cabinet and drawers 18 slidingly mounted within the housing, such that the wires and cords do not become tangled or interfere with movement of the drawers.

Referring in particular to FIGS. 1 through 4, the means for providing passive cooling includes interior ports 20 and exterior ports 22 in the housing 16. The interior ports 20 are positioned above, i.e. at a greater height than, the exterior ports 22, and convection passageways 24 connect the exterior ports and the interior ports such that warm air, illustrated by arrows A, rises within the passageways 24 by natural convection from the exterior ports 22 to the higher interior ports 20. The means for providing passive cooling also includes inlets 28, 29 in each drawer 18 of the cabinet 10. The inlets 28, 29 are positioned to allow airflow A to enter storage spaces 30 in the drawers 18 from the interior ports 20 of the housing 16, when the drawers are in their closed position. Thus, relatively cool ventilating airflow A is drawn through the convection passageways 24, through the inlets 28, 29 of the drawers 18, and into the storage spaces 30 defined by the drawers 18 to cool charging electronic devices stored therein.

The ventilating airflow A, of course, gradually warms as it picks up and carries heat away from the charging electronic devices 12 stored in the drawers 18. In order to allow the warmer airflow A to exit the storage cabinet 10, the drawers 18 are provided with outlets 26, and an upper portion of the housing 16 is provided with outlets 27. Thus, the means for providing passive cooling according to the present disclosure, releases excess heat from within the cabinet 10 to prevent the electronic devices 12 stored therein from overheating.

While it should be understood that the means for providing passive cooling disclosed herein can be incorporated in a storage cabinet 10 having a single drawer 18 or a storage cabinet 10 having a multiplicity of drawers 18, an illustrated embodiment of the storage cabinet 10 according to the present invention, as shown in FIGS. 1 through 4, includes two columns of three vertically stacked drawers 18.

The housing 16 of the storage cabinet 10, which can be mounted on a stand 32 for convenience, includes a base 34 and a cap 36, and two hollow outer walls 38, 40 and a hollow middle wall 42 vertically extending between the base 34 and the cap 36 and supporting the drawers 18 therebetween. A rear panel 44 extends between the base 34, the walls 38, 40, 42 and the cap 36 to close the back of the cabinet 10.

The hollow walls 38, 40, 42 define the convection passageways 24 of the housing 16. The hollow outer walls 38, 40 have a multiplicity of the interior ports 20 on only a single, inwardly facing side, while the hollow middle wall 42 has a multiplicity of the interior ports 20 on both sides. The interior ports 20 of the housing 16 are provided in the form of upwardly facing louvered vents. The hollow walls 38, 40, 42 each have a closed top, while the exterior ports 22 of the housing comprise open bottoms of the walls.

The cap 36 includes a plurality of the outlets 27 in the form of downwardly facing louvered vents. In addition, the base 34 includes inlets 46 in the form of downwardly facing louvered vents, and inlets 48 communicating with the interior of the housing 16, for allowing additional cooling airflow A.

The housing 16 can further includes electrical outlets 50 and telephone jacks 52 for connection to electronic devices 12 stored within the cabinet 10. Shelves 54 are provided on the rear panel 44 of the housing 16 for holding electrical charging adaptors of the electronic devices 12.

The drawers 18 are preferably mounted on ball bearing glides 56 secured to the walls 38, 40, 42 of the housing 16, such that each drawer 18 can be easily moved between a closed position, wherein the storage space 30 within the drawer 18 is inaccessible from outside the housing 16, and an open position, wherein the drawer 18 extends out of the housing 16 such that the storage space is accessible. Each drawer 18 includes a bottom panel 58, side panels 60, a rear panel 62 and an exterior front panel 64. The rear panel 62 of each drawer 18 is shaped to receive cords and wires 14 for the electronic devices 12 therethrough, while the exterior front panel 64 includes a handle 66 for allowing the drawer 18 to be opened and closed. The exterior front panel 64 of each drawer 18 can also include a lock 68 for allowing the drawer 18 to be locked in a closed position.

The exterior panel 64 of each drawer 18 includes a plurality of the outlets 26, while the side panels 60 include a plurality of the inlets 28. Both of the inlets 28 and the outlets 26 of the drawer 18 are provided in the form of downwardly facing louvered vents. Thus, as shown best in FIG. 4, the louvered vents 28 in the side panels 60 of the drawers 18 and the louvered vents 20 in the walls 38, 40, 42 of the housing 16 are preferably arranged such that they are aligned and facing when the drawers 18 are in their closed positions, to better allow and encourage airflow A therebetween. The bottom panels 58 of the drawers 18 also include inlets 29 to allow additional airflow A between the storage space 30 of the drawers 18 and the convection passageways 24 of the housing 16.

Figures 5, 6:
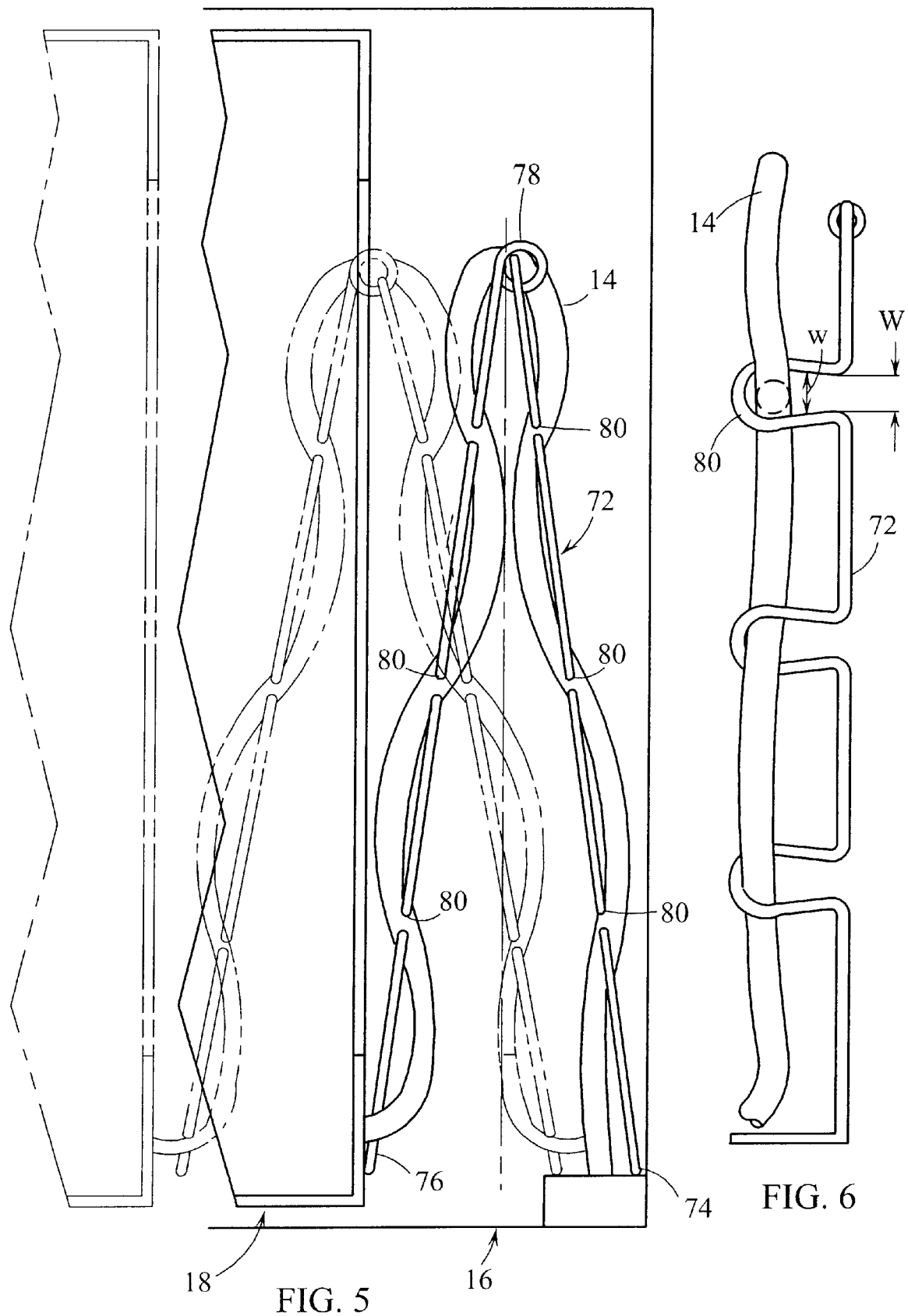
FIG. 5 shows a top plan, somewhat schematic view of one of the drawers of the storage cabinet of FIG. 1 moving from a closed to an open position, with the articulated cord support extending between the drawer and the housing of the cabinet and supporting a cord.
FIG. 6 shows a top plan view of a portion of one of the articulated cord supports of the storage cabinet of FIG. 1 supporting a cord.

Referring to FIGS. 5 and 6, the means for supporting the wires and cords 14 comprises articulated cord supports 72 mounted between the rear panel 62 of each drawer 18 and the rear panel 44 of the housing 16 for supporting the data transmission and/or power cords 14 for each drawer 18. Each support 72 has a first end 74 pivotly connected to the housing 16, a second end 76 pivotly connected to the support's respective drawer 18, and at least one joint 78 positioned between the first and the second ends for allowing the support to bend and move with the drawer as the drawer is moved between an open and closed position. As shown best in FIG. 6, each support 72 also defines a plurality of U-shaped recesses 80, wherein the top portions of the U's have a width W a little less than a width w of typical wires or cords 14 threaded therethrough, such that the wires or cords are retained within the recesses 80 without the use of separate wire/plastic ties or other like fasteners.

In summary, the present disclosure provides a storage cabinet 10 having locking drawers 18 to provide a secure storage environment electronic devices 12, electrical outlets for recharging the stored electronic devices, and telephone jacks for transmitting data to and from the stored electronic devices. In additon, the present disclosure provides a storage cabinet 10 having means for cooling in order to maintain stored, recharging electronic devices 12 below a threshold temperature to prevent the devices from overheating and turning off. Furthermore, the storage cabinet 10 incorporates a passive cooling means, such that fans or like active cooling means are not necessary, and such that the complexity, cost and necessary maintainence of the storage cabinet 10 is reduced. The present disclosure also provides a storage cabinet 10 having means for supporting data transmission and/or power cords between each sliding drawer 18 and the cabinet 10, such that the cords do not become tangled.

The principles, preferred embodiments and modes of operation of the presently disclosed storage cabinet have been described in the foregoing specification. The disclosed storage cabinet, however, is not to be construed as limited to the particular embodiments shown, as these embodiments are regarded as illustrious rather than restrictive. Moreover, variations and changes may be made by those skilled in the art without departing from the spirit of the presently disclosed storage cabinet.

What is claimed is:

1. A storage cabinet comprising:
   a.) a housing including,
   at least one exterior port,
   a plurality of interior ports vertically spaced relative to each other and positioned above the exterior port, and
   a vertically-extending convection passageway connecting in fluid communication the exterior port and the plurality of interior ports such that warm air will rise within the passageway by natural convection in the direction from the exterior port toward the plurality of interior ports; and
   b.) a plurality of drawers vertically spaced relative to each other and slidably mounted within the housing, each drawer being moveable between a closed position wherein a storage space within the drawer is inaccessible from outside the housing, and an open position wherein the drawer extends out of the housing such that the storage space is accessible, each drawer including,
   at least one inlet port formed through a side wall of the drawer, wherein each inlet port corresponds in position on the drawer to a respective interior port of the housing so that upon moving the drawer into the closed position, the inlet port is aligned with the respective interior port of the housing, to thereby place the interior and inlet ports in fluid communication with each other and allow airflow to pass from each interior port of the housing through the corresponding inlet port and into the storage space of the respective drawer when the drawer is in the closed position.

2. The storage cabinet of claim 1 wherein the inlet ports of the drawers and the interior ports of the housing are defined by louvered vents, and when each drawer is in the closed position, the respective pairs of louvered vents of the housing and drawer are aligned in overlying fluid communication with each other.

3. The storage cabinet of claim 2 wherein for each aligned pair of inlet and outlet ports, one of the inlet ports of the drawers and the interior ports of the housing faces upwardly, and the other of the inlet ports of the drawers and the interior ports of the housing faces downwardly.

4. The storage cabinet of claim 1 wherein the housing comprises:
   a base;
   a cap; and
   at least two hollow walls extending between the base and the cap, laterally spaced relative to each other, and supporting the plurality of drawers therebetween, wherein each hollow wall defines a plurality of the interior ports of the housing for alignment with the inlet ports of the drawers, a respective exterior port of the housing, and a respective convection passageway of the housing extending between the respective interior ports and the at least one exterior port.

5. The storage cabinet of claim 4 wherein the base includes at least one inlet coupled in fluid communication between the exterior of the housing and the convection passageway for introducing air into the housing.

6. The storage cabinet of claim 4 wherein the cap includes at least one outlet coupled in fluid communication between the convection passageway and the exterior of the housing for exhausting air from the housing.

7. The storage cabinet of claim 4 wherein each drawer includes two upstanding side walls, upstanding front and back walls extending between the upstanding side walls, and a bottom wall extending between the front, back and side walls, to thereby define the storage space within the drawer, wherein the upstanding back wall defines at least one outlet port to allow airflow to pass therethrough out of the storage space.

8. The storage cabinet of claim 1 further comprising at least one articulated arm for supporting at least one wire or cord between the housing and a respective drawer, the at least one articulated arm including:
   a first elongated arm portion defining a first end and a second end, wherein the first end is pivotally coupled to the housing,
   a second elongated arm portion defining a first end and a second end, wherein the first end is pivotally coupled to the second end of the first elongated arm portion, and the second end is pivotally coupled to the drawer to thereby allow the articulated arm to be movable with the drawer,
   wherein each of the first and second elongated arm portions defines a plurality of recesses spaced relative to each other in the elongated direction of the respective arm portion, and the at least one wire or cord extends along each arm portion in the elongated direction thereof and is threadedly received through the plurality of recesses to support the at least one wire or cord between the housing and the drawer and thereby prevent the at least one wire or cord from becoming tangled or interfering with movement of the drawer.

9. The storage cabinet of claim 1 further comprising a plurality of electrical outlets, each electrical outlet being mounted adjacent to a respective drawer for providing electricity to a component received within the drawer.

10. The storage cabinet of claim 1 further comprising a plurality of telephone plugs, each telephone plug being mounted adjacent to a respective drawer for providing telephone access to a component received within the drawer.

11. The storage cabinet of claim 1 further comprising at least one lock for allowing each of the plurality of drawers to be locked in the closed position.

12. A storage cabinet as defined in claim 1, wherein each of a plurality of drawers includes a base panel and at least one side panel extending upwardly from the base panel, and at least one first inlet port is formed through the side panel, and at least one second inlet port is formed through the base panel, and wherein the housing defines a plurality of groups of the interior ports, wherein the groups of interior ports are vertically spaced relative to each other, and each group corresponds in position to the first and second inlet ports of a respective drawer so that upon moving each drawer into the closed position, the first and second inlet ports of the respective drawer are each aligned with a respective interior port.

13. A storage cabinet as defined in claim 12, wherein each of the plurality of drawers further includes two side panels and a rear panel extending between the two side panels, and the rear panel defines at least one outlet port for exhausting air from the storage space of the drawer.

14. A storage cabinet as defined in claim 12, wherein each of the plurality of drawers further includes a front panel extending between the two side panels, and the front panel defines at least one port formed through the panel for further connecting the storage space of the drawer in fluid communication with the exterior of the housing.

15. A storage cabinet as defined in claim 14, wherein a plurality of the interior ports and inlet ports are defined by louvered vents, and upon moving each drawer into the closed position, the louvered vents of the drawer are aligned in overlying relationship with the corresponding louvered vents of the housing.

16. A storage cabinet as defined in claim 12, wherein each group defines a respective pair of interior ports, each pair is spaced adjacent to and aligned with a respective drawer, and upon moving the drawer into the closed position, one of the interior ports is is aligned with a respective first inlet port formed through the side panel of the drawer, and the other of the pair of interior ports is aligned with a respective second inlet port formed through the base panel of the drawer.

17. A storage cabinet comprising:
a.) a housing;
b.) a plurality of drawers vertically spaced relative to each other and slidably mounted within the housing, each drawer being moveable between a closed position wherein a storage space within the drawer is inaccessible from outside the housing, and an open position wherein the drawer extends out of the housing such that the storage space is accessible;
c.) at least one articulated arm for supporting at least one wire or a cord extending between the housing and a respective drawer, the at least one articulated arm including:
a first elongated arm portion defining a first end and a second end, wherein the first end is pivotally coupled to the housing, and
a second elongated arm portion defining a first end and a second end, wherein the first end is pivotally coupled to the second end of the first elongated arm portion, and the second end is pivotally coupled to the drawer to thereby allow the articulated arm to be movable with the drawer,
wherein each of the first and second elongated arm portions includes a bar defining a plurality of recesses spaced relative to each other in the elongated direction of the respective arm portion, and wherein the at least one wire or cord is threadedly receivable through the plurality of recesses in the elongated direction of the respective arm portion to thereby support the at least one wire or cord between the housing and the drawer and prevent the wire or cord from becoming tangled or interfering with movement of the drawer.

18. The storage cabinet of claim 17 wherein the plurality of recesses includes at least one U-shaped recess dimensioned to frictionally retain a wire or cord.

19. The storage cabinet of claim 17 further comprising a plurality of electrical outlets, each electrical outlet being mounted adjacent to a respective drawer for providing electricity to a component received within the drawer.

20. The storage cabinet of claim 17 further comprising a plurality of telephone plugs, each telephone plug being mounted adjacent to a respective drawer for providing telephone access to a component received within the drawer.

21. The storage cabinet of claim 17 further comprising at least one lock for allowing each of the plurality of drawers to be locked in the closed position.

22. The storage cabinet of claim 17 wherein:
a.) the housing includes
at least one exterior port,
a plurality of interior ports vertically spaced relative to each other and positioned above the exterior port, and
a vertically-extending convection passageway connecting in fluid communication the exterior port and the plurality of interior ports such that warm air will rise within the passageway by natural convection in the direction from the exterior port toward the plurality of interior ports; and
b.) each drawer includes
at least one inlet port formed through a side wall of the drawer, the at least one inlet port corresponding in position on the drawer to a respective interior port of the housing so that upon moving the drawer into the closed position, the inlet port is aligned with the respective interior port of the housing to thereby place the interior and inlet ports in fluid communication with each other and allow airflow to pass from each interior port of the housing, through the corresponding inlet port, and into the storage space of the respective drawer when the drawer is in the closed position.

23. A storage cabinet as defined in claim 17, comprising a plurality of articulated arms, each articulated arm being pivotally coupled to a respective drawer.

24. A storage cabinet as defined in claim 17, wherein the bar of each elongated arm portion is formed by an elongated rod defining a plurality of approximately straight portions and a plurality of bent portions formed between straight portions, and at least a plurality of the bent portions each defines a respective one of said recesses.

25. A storage cabinet as defined in claim 17, wherein each recess defines a first width at an upper portion of the recess, and a second width at a lower portion of the recess, and wherein the first width is less than the second width for retaining the at least one wire or cord within the lower portion of the recess.

26. A storage cabinet comprising:
a.) a housing;
b.) a plurality of drawers vertically spaced relative to each other and slidably mounted within the housing, each drawer being moveable between a closed position wherein a storage space within the drawer is inaccessible from outside the housing, and an open position wherein the drawer extends out of the housing such that the storage space is accessible;
wherein the housing includes:
at least one exterior port,
a vertically-extending convection passageway coupled in fluid communication to the at least one exterior port for receiving air drawn into the exterior port and allowing the air to rise upwardly through the convection passageway; and
a plurality of first means vertically spaced relative to each other and formed through a side wall of the convection passageway for receiving the air rising through the passageway and directing the air into the drawers; and
wherein each drawer includes:
second means formed through a side wall of the drawer for directing air to pass from a respective first means of the housing through the second means and into the storage space of the respective drawer when the drawer is in the closed position, wherein each second means corresponds in position on the drawer to a respective first means of the housing so that upon moving the drawer into the closed position, the second means is aligned with the respective first means of the housing to thereby place the first and second means in fluid communication with each other.

27. A storage cabinet as defined in claim 26, wherein each first means is defined by an interior port formed through the wall of the convection passageway.

28. A storage cabinet as defined in claim 26, wherein each second means is defined by an inlet port formed through a side wall of the respective drawer.

* * * * *